(12) United States Patent
Silvernail

(10) Patent No.: US 6,998,648 B2
(45) Date of Patent: Feb. 14, 2006

(54) PROTECTED ORGANIC ELECTRONIC DEVICE STRUCTURES INCORPORATING PRESSURE SENSITIVE ADHESIVE AND DESICCANT

(75) Inventor: Jeffrey Alan Silvernail, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/648,763

(22) Filed: Aug. 25, 2003

(65) Prior Publication Data

US 2005/0045900 A1   Mar. 3, 2005

(51) Int. Cl.
*H01L 33/00* (2006.01)
(52) U.S. Cl. .............. 257/99; 257/40; 257/81; 257/98; 257/100; 257/682; 257/913
(58) Field of Classification Search ............ 257/40, 257/81, 98, 99, 100, 682, 913
See application file for complete search history.

(56) References Cited

U.S. PATENT DOCUMENTS

| | | | |
|---|---|---|---|
| 4,842,893 A | 6/1989 | Yializis et al. | 427/44 |
| 4,954,371 A | 9/1990 | Yializis | 427/44 |
| 5,260,095 A | 11/1993 | Affinito | 427/124 |
| 5,703,436 A | 12/1997 | Forrest et al. | 313/506 |
| 5,707,745 A | 1/1998 | Forrest et al. | 428/432 |
| 5,757,126 A | 5/1998 | Harvey, III et al. | 313/506 |
| 5,920,080 A | 7/1999 | Jones | 257/40 |
| 6,146,225 A | 11/2000 | Sheats et al. | 445/24 |
| 6,224,948 B1 | 5/2001 | Affinito | 427/488 |
| 6,268,695 B1 | 7/2001 | Affinito | 313/506 |
| 2002/0125822 A1 | 9/2002 | Graff et al. | 313/506 |
| 2003/0062830 A1 | 4/2003 | Guenther et al. | 313/512 |
| 2003/0085652 A1 | 5/2003 | Weaver | 313/506 |
| 2003/0117068 A1 | 6/2003 | Forrest et al. | 313/504 |
| 2003/0143423 A1 | 7/2003 | McCormick et al. | 428/690 |
| 2003/0197197 A1 * | 10/2003 | Brown et al. | 257/200 |

FOREIGN PATENT DOCUMENTS

| | | |
|---|---|---|
| WO | WO 00/26973 | 5/2000 |
| WO | WO 00/36665 | 6/2000 |
| WO | WO 02/05361 | 1/2002 |

OTHER PUBLICATIONS

Silvernail, J. et al., "Packaging OLED Displays Using Dual Stage Pressure Sensitive Adhesives," 1-page Abstract, Jul. 12, 2002.
Silvernail, J. et al., "Packaging OLED Displays Using Dual Stage Pressure Sensitive Adhesives," 15 page Power Point Presentation, presented on Oct. 11, 2002.
Craig Adhesives and Coatings Company, UV Pressure Sensitive Adhesives, http://www.craigadhesives.com/UV/Laminating.htm; and Products, http://www.craigadhesives.com/products.htm.

(Continued)

*Primary Examiner*—Minhloan Tran
*Assistant Examiner*—Tan Tran
(74) *Attorney, Agent, or Firm*—Mayer & Williams PC; David B. Bonham, Esq.

(57) ABSTRACT

Organic electronic device structures are provided, which comprise: (a) a first portion comprising a substrate and an organic electronic device region (e.g., an OLED region) disposed over the substrate; (b) a second portion comprising a cover and a getter region; and (c) a radiation-curable, pressure-sensitive adhesive layer disposed between the first and second portions and adhering the first and second portions to one another. The adhesive layer is disposed over the entire organic electronic device region and over at least a portion of the substrate. Other aspects of the present invention are directed to methods of making the above structures.

31 Claims, 7 Drawing Sheets

OTHER PUBLICATIONS

Adhesives Research Inc., Standard Product Catalogue, http://www.adhesivesresearch.com/catalog/home/htm; Specialty Industrial and Electronics Tapes, www.adhesivesresearch.com/catalog/indust/htm; Industrial and Electronics Products, www.adhesivesresearch.com/catalog/indelec.htm; Product Development Process www.adhesivesreseach.com/techcntr/atcprddv.htm; and Materials Technologies, www.adhesivesresearch.com/techcntr/atcmatr.htm.

Hybrid Design For Organic Electroluminescent Devices, IBM Technical Disclosure Bulletin, Sep. 1, 1997, vol. 40, Issue 9, p. 115-116.

Lu, M. H. et al., "High-efficiency top-emitting organic light-emitting devices," Applied Physics Letters, vol. 81, No. 21, Nov. 18, 2002, pp. 3921-3923.

\* cited by examiner

PROTECTED ORGANIC ELECTRONIC DEVICE STRUCTURES INCORPORATING PRESSURE SENSITIVE ADHESIVE AND DESICCANT

STATEMENT OF RELATED APPLICATION

This application is related to U.S. application Ser. No. 10/407,820 filed Apr. 4, 2003 and to U.S. application Ser. No. 10/122,969 filed Apr. 12, 2002, both entitled "Protected Organic Electronic Devices and Methods for making the same."

FIELD OF THE INVENTION

The present invention relates to organic electronic devices that are protected from environmental elements such as moisture and oxygen.

BACKGROUND OF THE INVENTION

Organic electronic devices including circuits, for example, organic light emitting diodes, organic electrochromic displays, organic photovoltaic devices and organic thin film transistors, are known and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

In general, two-dimensional OLED arrays for imaging applications are known in the art and typically include an OLED region, which contains a plurality of pixels arranged in rows and columns. FIG. 1A is a simplified schematic representation (cross-sectional view) of an OLED structure of the prior art. The OLED structure shown includes an OLED region 15 which includes a single pixel comprising an electrode region such as anode region 12, a light emitting region 14 over the anode region 12, and another electrode region such as cathode region 16 over the a light emitting region 14. The OLED region 15 is disposed on a substrate 10.

Traditionally, light from the light-emitting layer 14 is passed downward through the substrate 10. In such a "bottom-emitting" configuration, the substrate 10 and anode 12 are formed of transparent materials. The cathode 16 and cover 20 (i.e., barrier), on the other hand, need not be transparent in this configuration.

Other OLED architectures are also known in the art, including "top-emitting" OLEDs and transparent OLEDs. For top-emitting OLEDs, light from the light emitting layer 14 is transmitted upward through cover 20. Hence, the substrate 10 can be formed of opaque material, if desired, while the cover 20 is transparent. In top-emitting configurations based on a design like that illustrated in FIG. 1A, a transparent material is used for the cathode 16, while the anode 12 need not be transparent.

For transparent OLEDs, in which light is emitted out of both the top and bottom of the device, the substrate 10, anode 12, cathode 16 and cover 20 are all transparent.

Structures are also known in which the positions of the anode 12 and cathode 16 in FIG. 1A are reversed as illustrated in FIG. 1B. Such devices are sometimes referred to as "inverted OLEDs".

In forming an OLED, a layer of low work function metal is typically utilized as the cathode to ensure efficient electron injection and low operating voltages. Low work function metals, however, are chemically reactive; exposure to and subsequent reaction with oxygen and moisture can severely limit the lifetime of the devices. Moisture and oxygen are also known to produce other deleterious effects, for instance, reactions with the organic materials themselves. For example, moisture and oxygen are known in the art to increase "dark spots" and pixel shrinkage in connection with OLEDs.

With the aid of a sealing region 25, the cover 20 and the substrate 10 cooperate to restrict transmission of oxygen and water vapor from an outer environment to the active pixel 15. Typically, the cover 20 is attached to the substrate 10 via sealing region 25 under a clean, dry, inert atmosphere. The cover is commonly made from glass, metal or plastic, with an indentation or cavity in the cover that provides a location for a getter material, which may be in the form of a pouch, thin film or thick film.

Sealing region 25 is commonly a ring of UV-curable liquid adhesive, such as an epoxy resin. Epoxy resins, however, are typically not flexible, rendering these materials undesirable for use in connection with flexible OLEDs. In addition, because they are typically inflexible, because they are not pressure sensitive, and because they are typically applied in liquid form, epoxy resins are not readily adaptable for use in web-based manufacturing techniques. Moreover, epoxy resins frequently contain ingredients that are deleterious to OLEDs. Analogous difficulties are encountered in organic electronic devices other than OLEDs.

Another type of adhesive material that is currently being utilized is a UV-curable pressure sensitive adhesive. This material is typically provided between two carrier films. Upon removal of one of the carrier films, the exposed adhesive, being pressure sensitive, is attached to either the cover or the substrate by simple contact. Subsequently, the second carrier film is removed, allowing the cover and the substrate to be attached to one another. Curing is completed by the application of ultraviolet-radiation.

Although such adhesive layers do provide a degree of protection from the outside environment, the barrier properties of these adhesive layers are often insufficient to protect the OLED device from premature degradation in commercial applications.

SUMMARY OF THE INVENTION

The above and other challenges are addressed by the present invention, in which a pressure sensitive adhesive is combined with a getter material to improve the protection of organic electronic devices from the surrounding environment.

According to one aspect of the invention, organic electronic device structures are provided, which comprise: (a) a first portion comprising a substrate and an organic electronic device region, for example, an OLED region, disposed over the substrate; (b) a second portion comprising a cover and a getter region; and (c) a radiation-curable, pressure-sensitive adhesive layer, which is disposed between the first and second portions and adheres the first and second portions to one another. The adhesive layer is disposed over the entire organic electronic device region and over at least a portion of the substrate. In certain beneficial embodiments, the adhesive layer is an ultraviolet-radiation-curable, pressure-sensitive adhesive layer, which exhibits low out-gassing of harmful species.

The adhesive layer is disposed within the device structure in any of a number of configurations. For example, in some embodiments, the adhesive layer is in the form a continuous layer, while in other embodiments the adhesive layer comprises two or more distinct elements. A continuous layer is beneficial in some embodiments because manufacturing and handling are simplified. The getter region can also be disposed within the device structure in a variety of configurations. For example, in some embodiments, the getter region is provided in the form of a continuous region, while in other embodiments, the getter region comprises two or more distinct regions. As another example, the getter region in some embodiments is provided on a surface of the cover, while in other embodiments, the getter region is provided within one or more grooves that are formed in the cover.

According to another aspect of the present invention, methods of making devices like those above are provided. These methods comprise (a) providing a first portion comprising a substrate and an organic electronic device region disposed over the substrate and a second portion comprising a cover and a getter region; (b) attaching the first portion to the second portion with a radiation-curable, pressure-sensitive adhesive layer by application of pressure; and (c) exposing the adhesive layer to radiation (e.g., ultraviolet radiation).

An advantage of the present invention is that organic electronic structures are provided, which are effective in protecting sensitive device components from oxygen, moisture and other harmful species in the surrounding atmosphere.

Another advantage of the present invention is that organic electronic structures are provided, which afford protection from these harmful species, while at the same time being flexible and conformable to other surfaces, if desired.

Another advantage of the present invention is that organic electronic structures are provided, which are amenable to continuous processing techniques, such as web-based (e.g., roll-to-roll) manufacturing methods.

Still other advantages accrue from the fact that the adhesive layer is disposed over the entire organic electronic device region.

For example, it is known in the organic electronic device art to provide a getter material within a rigid cover, with the getter material being separated from the organic electronic device region by an air gap. In general, the present inventors have found that it is desirable to position the getter as close as is possible to the organic electronic device region. However, certain getter materials produce potentially harmful byproducts (e.g., acids) upon reacting with gaseous species from the outside environment (e.g., water). By covering the entire organic electronic device region with adhesive, however, the organic electronic device region is isolated from such harmful species, allowing the getter region to be positioned in close proximity to the organic electronic device region. At the same time, all adhesives, including the pressure-sensitive adhesive layers used herein, have an associated non-zero permeation rate. Accordingly the presence of the getter material is beneficial in that it absorbs harmful species as they permeate through the adhesive layer.

As another example, even if the getter material utilized does not produce potentially harmful byproducts, when dealing with a flexible device, the presence of a narrow air gap between the getter and the organic electronic device region affords little to no protection of the organic electronic device region during flexing, and damage to the organic electronic device region can occur due to contact between the organic electronic device region and the getter. By covering the entire organic electronic device region with adhesive, however, undesirable contact between the getter and the organic electronic device region is minimized, thereby protecting the organic electronic device region from such damage.

These and other aspects, embodiments and advantages of the present invention will become readily apparent to those of ordinary skill in the art upon review of the disclosure to follow.

As is typically the case with such figures, the above are simplified schematic representations presented for purposes of illustration only, and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein. For example, although the embodiments below are directed to OLED structures, the techniques and structures of the present invention are applicable to other organic electronic device structures as well.

As used herein, a "layer" of a given material includes a region of that material where the thickness is small compared to both its length and width. Examples of layers include sheets, foils, films, laminations, coatings, and so forth. As used herein, a layer need not be planar, but can be bent, folded or otherwise contoured, for example, to at least partially, or even completely, envelop another component. As used herein, a layer can also include multiple sub-layers. As used herein, a layer can constitute a single region of material, or it can consist of a collection of discrete regions of material (for example, a patterned layer can be provided in the form of a series of bands).

Figure 1A:
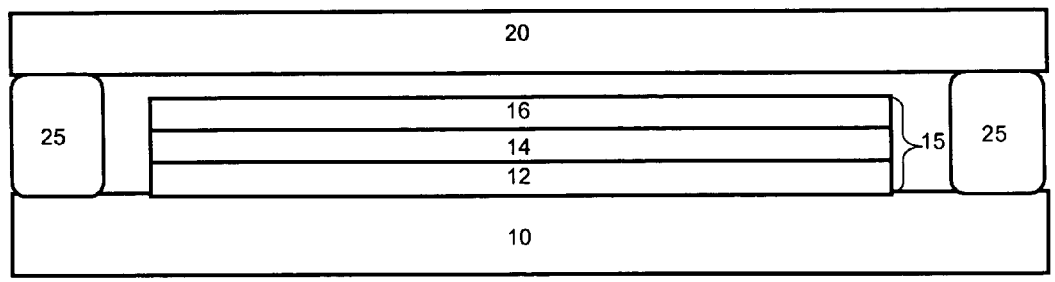
FIGS. 1A and 1B are schematic representations (cross-sectional views) of known OLED structures.
Figure 1B:
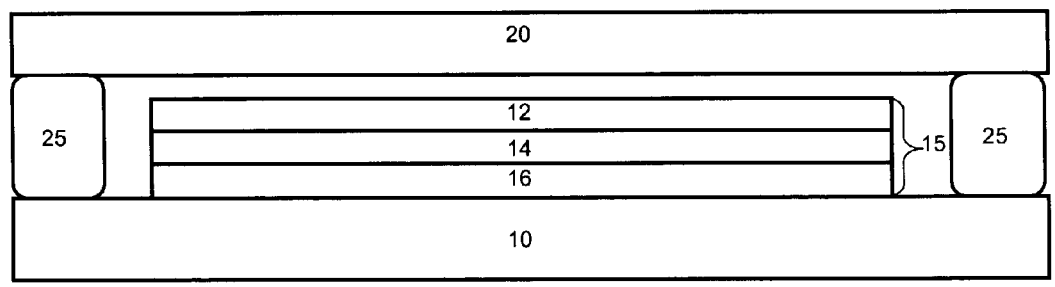
Figure 2A:
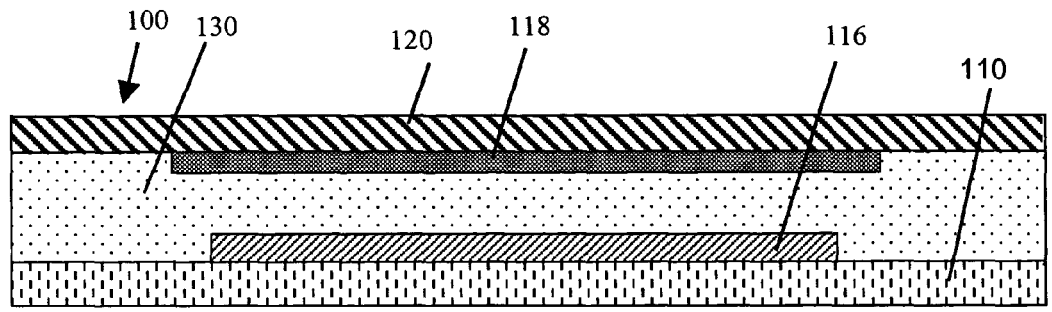
FIG. 2A is a schematic cross-sectional view of an OLED structure in accordance with an embodiment of the present invention.

FIG. 2A is a simplified schematic representation (cross-sectional view) of an OLED structure 100 in accordance with an embodiment of the present invention. The OLED structure 100 includes a lower structure portion consisting of an OLED region 116 situated on a substrate 110. Over the lower structure portion is an upper structure portion that includes a cover 120 and a getter region 118. The upper structure portion is attached to the lower structure portion by adhesive layer 130.

In addition to bonding the upper and lower portions of structure 100 to one another, the adhesive layer 130 also beneficially exhibits low out-gassing of harmful species, and beneficially provides a barrier to adverse species in the surrounding environment, including water and oxygen. As used herein, "displays low out-gassing of harmful species" means that out-gassing is sufficiently minimized to prevent unacceptably low product quality during production. For example, with respect to OLEDs, this expression means that out-gassing is sufficiently low to prevent the formation of an unacceptably high dark spot levels and/or pixel shrinkage during production and through the intended lifetime of the display.

The adhesive layer 130 of the present invention is a pressure sensitive adhesive layer, at least before it is subjected to a radiation curing step. As used herein, a "pressure sensitive" adhesive is one that adheres with as little as finger pressure, while requiring no activation for adhesion. Moreover, as discussed further below, in some embodiments of the invention, pressure sensitive adhesive layers are provided with a carrier film, making them desirable, for example, for use in web-based manufacturing techniques.

Preferred pressure sensitive adhesives for the adhesive layers of the present invention include the following: ARclean™ and ARclad® low-out-gassing adhesives available from Adhesives Research, Inc., Glen Rock, Pa.; Ultra-Clean Laminating Adhesive 501FL and Optically Clear Laminating Adhesive 8141 both available from 3M Bonding Systems Division, St. Paul, Minn.; and 1034-series adhesives available from Craig Adhesives and Coatings Company, Newark, N.J. The thickness of the adhesive region typically ranges from 0.5 to 10 mils, more typically 0.5 to 5 mils.

Getter region 118 is provided to remove reactive gases such as water and oxygen in the event that they penetrate the sealed package, before these gases have the opportunity to cause damage to the OLED region 116. The getter region 118 can be formed of essentially any getter material that reacts readily with active gases (including water and oxygen) so as to render them harmless to the device. Desiccants, a class of getter material that removes water, are useful for the practice of the present invention.

Preferred getter materials include Group IIA metals and metal oxides, such as calcium metal (Ca), barium metal (Ba), calcium oxide (CaO) and barium oxide (BaO). Preferred products include HICAP2000, a calcium oxide paste obtainable from Cookson SPM (Alpha Metals), which can be activated subsequent to application to the cover, for example, by baking in an inert atmosphere or vacuum; Q-Getter, a getter film obtainable from Frontech, Inc., Los Angeles, Calif., USA, which is approximately 0.15 mm thick, requires no activation and has an adhesive coating on one side facilitating adhesion of the getter film to the cover. Metal getter layers can also be applied to the cover, for example, using a number of vacuum deposition techniques such as thermal evaporation, sputtering, and electron-beam techniques.

Figure 2B:
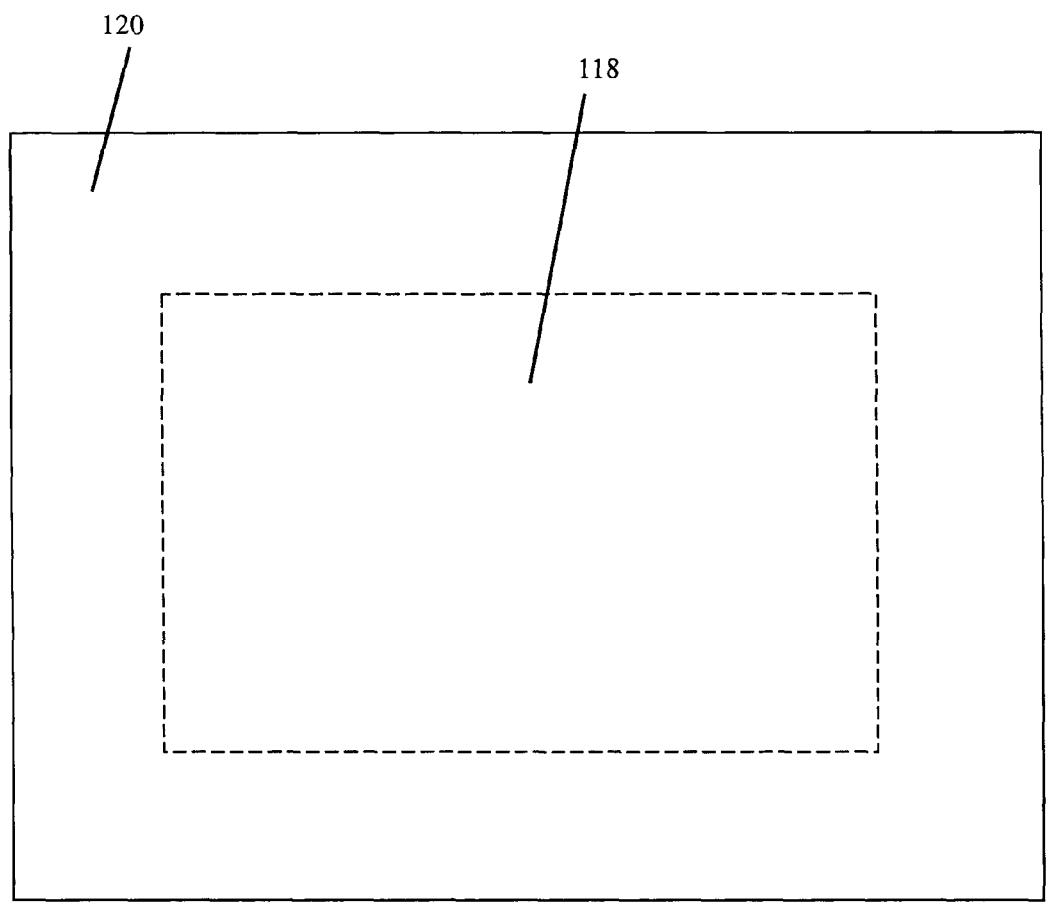
FIG. 2B is a top view of the OLED structure of FIG. 2A.

In the embodiment illustrated in FIGS. 2A and 2B, the getter region 118 is provided as a rectangular sheet on the cover 120. The getter region 118 in the top view of FIG. 2B lies beneath the cover 120 and is illustrated using dashed lines. (The adhesive 130, OLED region 116 and substrate 110 are not illustrated in FIG. 2B.)

The substrate 110 and cover 120 of the OLED structure 100 are selected to, among other things, restrict transmission of oxygen and water from the outside environment to the OLED region 116. Depending on the application, the substrate 110 and cover 120 can be opaque or transparent. For traditional bottom-emitting OLED structures, the substrate 110 will be transparent, as least in part, while the cover 120 can be opaque. For top-emitting OLED structures, the substrate 110 can be opaque, while the cover 120 will be transparent, at least in part. For transparent OLED structures, both the substrate 110 and the cover 120 will be transparent, at least in part. By "transparent" is meant that attenuation of radiation as it passes through the region of interest is low, with transmissivities typically greater than 50%, more typically greater than 80%, at the wavelength of interest.

The materials selected for the substrate 110 and cover 120 will depend upon the application at hand, and include semiconductors, metals including metal alloys, ceramics, polymers and composite layers. Semiconductors such as silicon offer good barrier properties to water, oxygen and other harmful species and also provide a substrate upon which electronic circuitry can be built. Metals also offer excellent barrier properties. Preferred materials include aluminum, stainless steel, gold, nickel, nickel alloys and indium, as well as other metals known in the art. Where flexibility is desired and transparency is not needed, metal foils can be used, for example, in flexible OLED structures known in the art that utilize flexible substrate and cover regions 110, 120. Ceramics also offer low permeability, and they provide transparency as well in some cases. Polymers are often preferred where optical transparency is desired and flexibility is desired. Preferred low permeability polymers include polyesters, polyethersulphones, polyimides, polycarbonates and fluorocarbons, with such layers commonly being used in connection with composite substrates or covers. Composite materials are advantageous, for example, in that they can provide transparency and flexibility, while also providing good resistance to transmission of chemical species such as water and oxygen. Composite substrates and covers are discussed further below in connection with FIGS. 5 and 6.

The OLED region 116 of FIGS. 2A and 2B can be of any design known in the art. For example, the OLED region 116 can comprise one or many pixels, which typically comprise an upper electrode layer and a lower electrode layer, one of which electrode layers is the anode and the other of which is the cathode, as well as a light-emitting layer (emission layer) disposed between the anode and cathode. The light emitting layer can be provided in connection with a number of configurations, including the following: (a) a three-layer configuration comprising a hole transporting sub-layer, an emission sub-layer and an electron transporting sub-layer (i.e., a double heterostructure configuration), (b) a two-layer configuration comprising a hole transporting sub-layer and a sub-layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons or excitons. Several structures for such devices are discussed, for example, in U.S. Pat. No. 5,707,745, the entire disclosure of which is hereby incorporated by reference. Other more complex OLED architecture is also practiced in the art.

Depending upon the application, the anode may be a transparent anode or an opaque anode (which can be a reflective in some cases). By "reflective" is meant that the amount of radiation reflected from a surface is high, with, with reflectivities typically greater than 50%, more typically greater than 80%, at the wavelength of interest. Opaque anode materials include metals such as gold, chromium, magnesium/silver or other materials known in the art, while transparent anode materials include metal oxides such as indium tin oxide (ITO), zinc tin oxide or other materials known in the art. Similarly, the cathode can be transparent or opaque depending on the application. Opaque cathode materials may include metals such as aluminum, aluminum/lithium, aluminum/lithium fluoride, or other materials is known in the art, while transparent cathode materials may include metal/metal oxide combinations such as Mg—Ag/ITO, Ca/ITO or other materials known in the art.

Figure 3A:
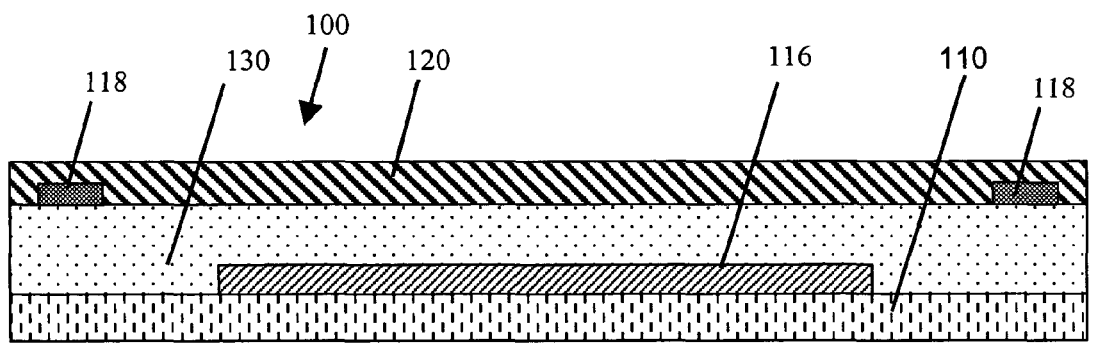
FIG. 3A is a schematic cross-sectional view of an OLED structure in accordance with another embodiment of the present invention.
Figure 3B:
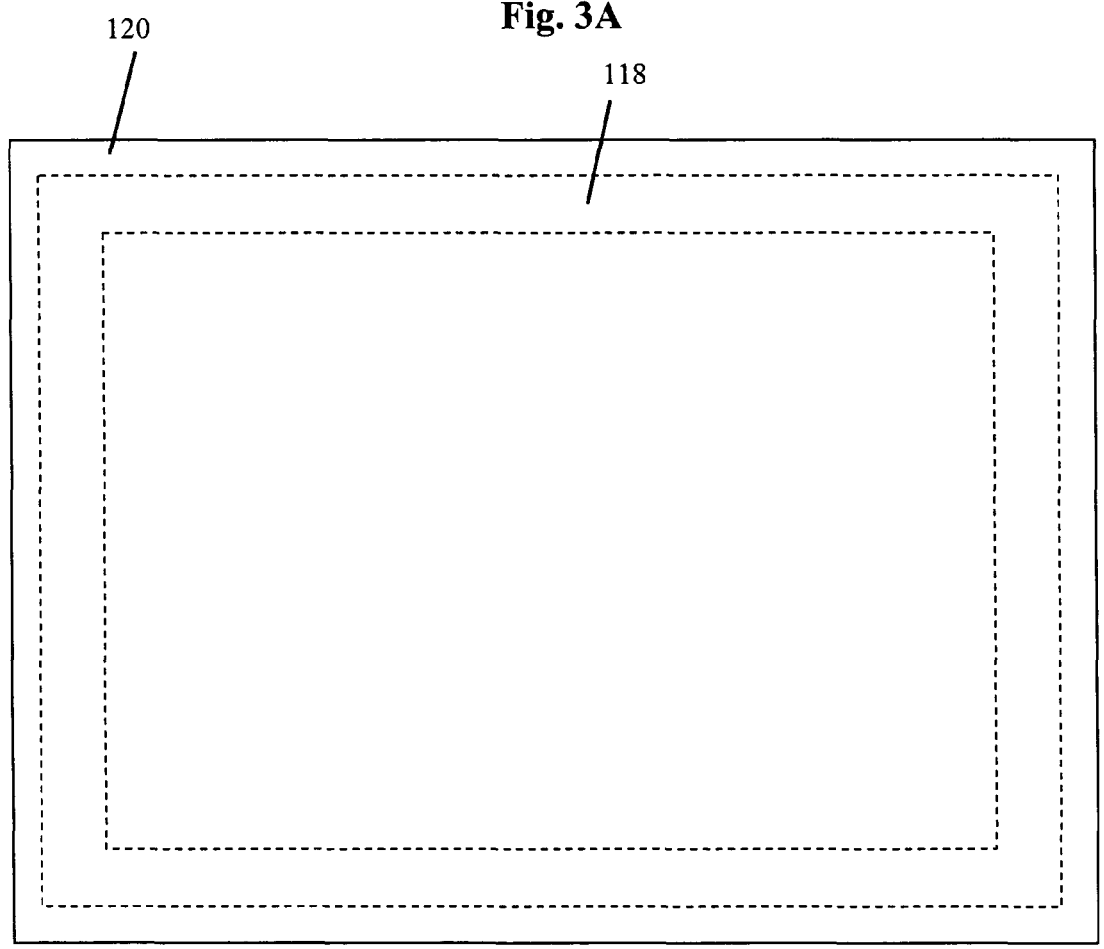
FIG. 3B is a top view of the OLED structure of FIG. 3A.

In some embodiments, such as that illustrated in FIGS. 2A and 2B above, the getter region 118 is simply applied as a layer on the surface of cover 118. In other embodiments, on the other hand, the getter region is provided within one or more depressions formed in the surface of the cover. For example, referring to FIGS. 3A and 3B, the getter region 118 is provided within a groove (in this particular embodiment, a groove in the form of a rectangular ring) in the cover 120. As in FIG. 2B above, the getter region 118 is illustrated by means of dashed lines in FIG. 3B (the adhesive 130, OLED region 116 and substrate 110 are not illustrated).

Whether provided on the surface of the cover, within a depression in the cover surface, or otherwise, the getter region 118 can be provided in essentially any pattern desired. For instance, in some cases, the getter material may have flexibility that is marginal for the application at hand (e.g., where the getter material is used within a flexible OLED). One way to address this issue is to make the dimensions of the getter region(s) small, for example, by providing the getter material in a patterned layer consisting of a number of narrow bands or dots. Also, where light is required to exit from the top of the OLED device (e.g., in the case of transparent and top-emitting OLEDs), the getter should be positioned so as to not substantially interfere with the transmission of light.

Patterns can be achieved by a variety of techniques. For example, where the getter region is vacuum deposited on the cover surface, a desired pattern can be provided by various vacuum-compatible techniques, including the use of a shadow mask during the deposition process. As another example, where the getter region is applied on the cover surface in the form of a paste or a liquid, a desired pattern can be provided by various techniques including screen-printing, ink-jet printing, dispensation through a syringe, or application by brush, roller or other applicator. As yet another example, the cover can be provided with grooves, trenches, indentations, or other depressions in the pattern desired (for example, by molding, machining, stamping, sandblasting or other techniques), and a getter material subsequently provided within the depression(s). The depression(s) can be filled, for example, with a liquid desiccant (e.g., via syringe) that is subsequently activated, for instance, by baking at elevated temperatures in an inert atmosphere or in a vacuum oven.

An advantage of OLED structures of the present invention is that they are effective in protecting sensitive device components from oxygen, moisture and other harmful species in the surrounding atmosphere. Without wishing to be bound by theory, it is believed that by applying the pressure sensitive adhesive layer over the OLED region, oxygen, moisture or other contaminants are forced to travel via a tortuous path before reaching the organic device region. At the same time, the getter material can be positioned adjacent the adhesive layer, such that contaminants are removed as they travel through the adhesive.

Moreover, getter materials that produce potentially harmful byproducts can be positioned in close proximity to the organic electronic device region, because the entire organic electronic device region is covered with pressure sensitive adhesive, isolating the organic electronic device region from the harmful byproducts.

The present invention is also advantageous in that it is possible to produce OLED structures that are flexible and conformable to other surfaces. Because the entire organic electronic device region is covered with the pressure sensitive adhesive, the organic electronic device region is protected from damage when the device is flexed.

Furthermore, it is possible to produce structures that are very thin in accordance with the present invention. For example, the present invention can be used in connection with very thin (e.g., 0.5 to 0.7 mm) glass, metal, polymer or composite covers.

The devices of the present invention can be constructed in a number of ways. As with most OLED fabrication processes, device fabrication is typically conducted in an inert atmosphere, for example, within a nitrogen glovebox, or in a vacuum.

Figure 8:
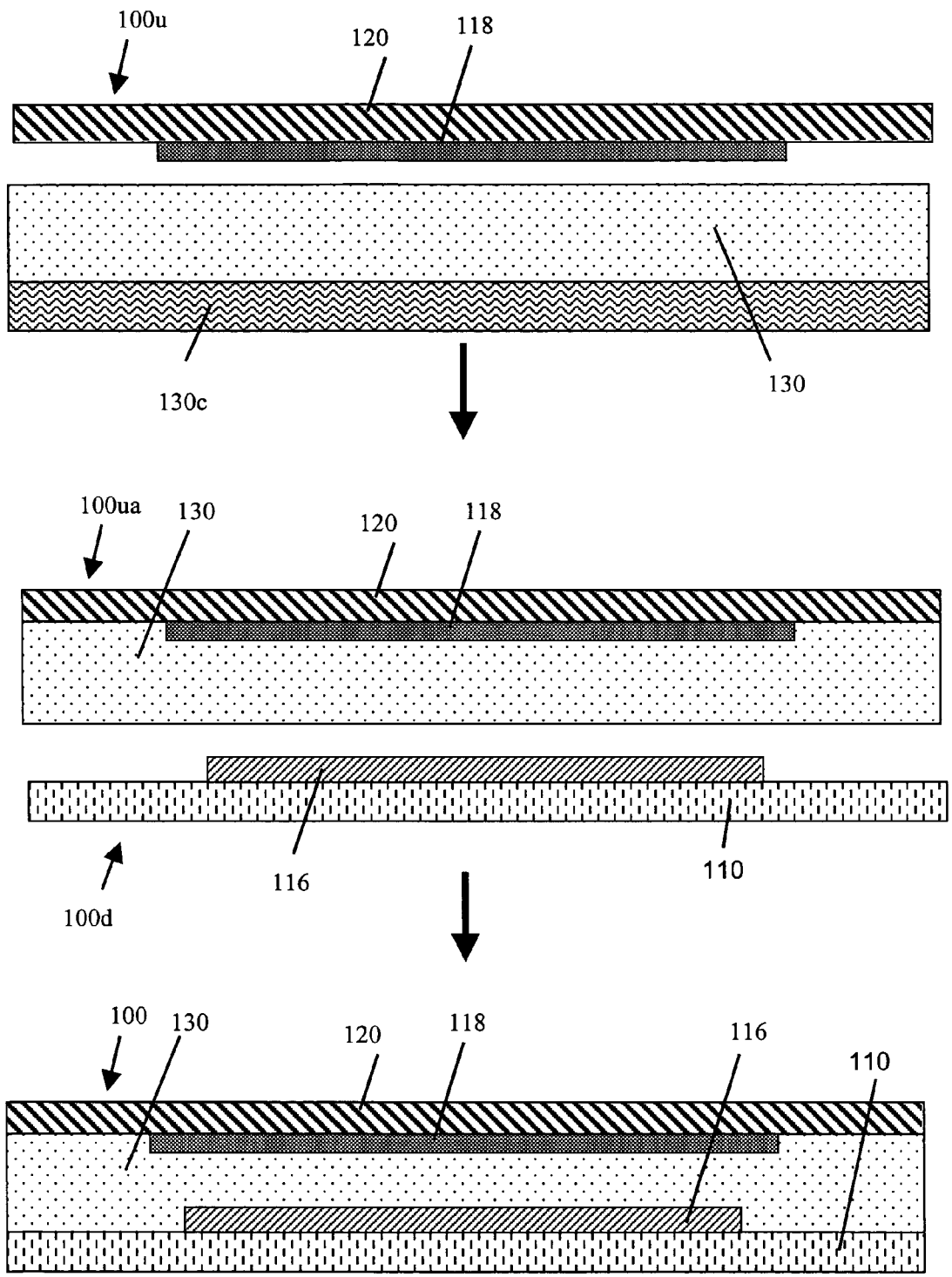
FIG. 8 is a schematic cross-sectional view of an OLED structure manufacturing process, in accordance with an embodiment of the present invention.

As a specific example, the device of FIGS. 2A and 2B can be constructed as illustrated in FIG. 8. In this embodiment, an adhesive layer 130 is initially applied to upper structure portion 100*u* (which consists of getter region 118 and cover 120). More particularly, the pressure sensitive adhesive 130 is first cut to match the outside dimensions of the cover 120. This can be done using a laser, knife, or any other suitable cutting device. Once cut, the carrier film is removed from one side of the pressure sensitive adhesive layer 130, and the pressure sensitive adhesive layer is attached to the upper structure portion 100*u*. Pressure is applied to ensure that the pressure sensitive adhesive layer 130 is securely attached to the upper structure portion 100*u*. Subsequently, the remaining carrier film 130*c* is removed from the pressure sensitive adhesive layer 130.

The upper structure portion with attached adhesive, generally designated 100*ua*, is then contacted with the lower structure portion 100*d* (which consists of substrate 100 and OLED region 116) using sufficient pressure to adhere the pressure sensitive adhesive layer 130 to the lower structure portion 100*d*. The adhesive layer 130 covers the entire OLED region 116 in this embodiment. Once the adhesive layer 130 is established between the upper and lower portions 100*u*, 100*d*, any bubbles that are found within the adhesive layer 130, or between the adhesive layer 130 and the upper or lower structure portions 100*u*, 100*d*, can then be removed as desired. For example, bubbles can be removed by heating the adhesive layer 130 to lower the viscosity of the same (e.g., by heating to between 40 and 70° C.), by applying a vacuum to the structure, by applying pressure to the structure (e.g., using rollers), or by a combination of any two of these techniques (e.g., using a vacuum oven) or all three of these techniques (e.g., by application of pressure within a vacuum oven). By providing the upper structure portion 100*u* with the adhesive region 130 in a separate processing step in this embodiment, the manufacturing throughput is improved.

After bubble removal, the adhesive layer 130 is typically cured by exposure to radiation, for example, by exposure to ultraviolet light in the case of UV-curable adhesives, by exposure to thermal radiation in the case of heat-curable adhesives, and so forth.

Figure 9:
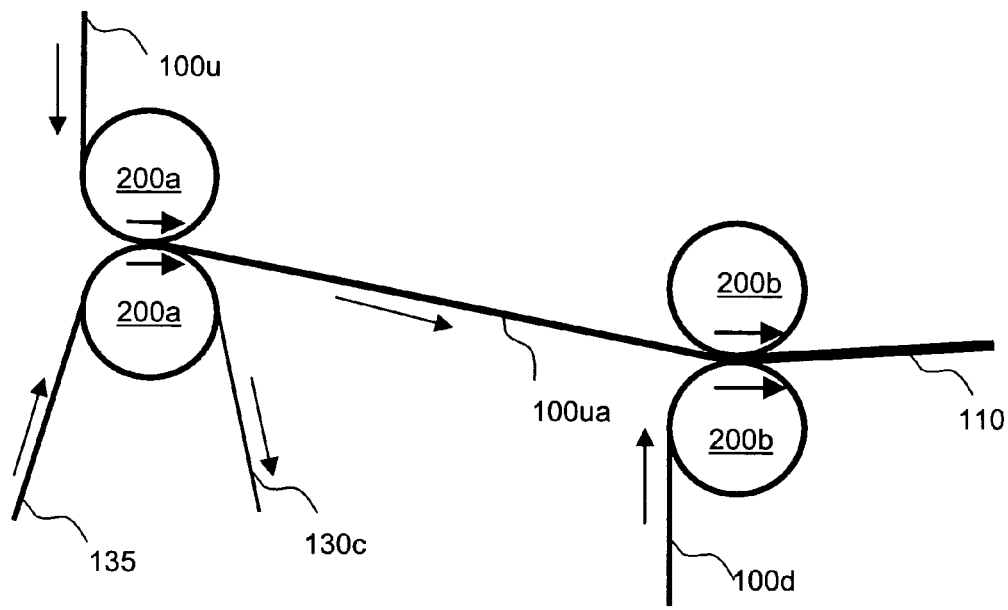
FIGS. 9 and 10 are schematic illustrations of OLED structure manufacturing processes, in accordance with various embodiments of the present invention.

A web-based scheme for attaching an upper structure portion 100u (containing, for example, a flexible cover and getter regions) to a lower structure portion 100d (containing, for example, a flexible substrate and OLED regions) is illustrated in FIG. 9. As seen in this figure, the upper structure portion 100u and an adhesive containing layer 135 (which includes an adhesive layer and an adjacent carrier film in this example) are fed through heated rollers 200a to soften the adhesive and prevent bubbles from becoming established between the upper structure portion 100u and the adhesive layer. After emerging from the rollers 200a, the carrier film 130c is removed. The resulting adhesive upper structure portion 100ua (which consists of upper structure portion 100u layer with attached adhesive layer in this embodiment) is then fed, along with lower structure portion 100d, through heated rollers 200b to again facilitate bubble removal. After emerging from the rollers 200b, the resulting OLED structure 110 is exposed, for example, to ultraviolet light (not illustrated) to cure the adhesive layer. The positions of the upper structure portion 100u and the lower structure portion 100d in FIG. 9 can be reversed, if desired.

Figure 10:
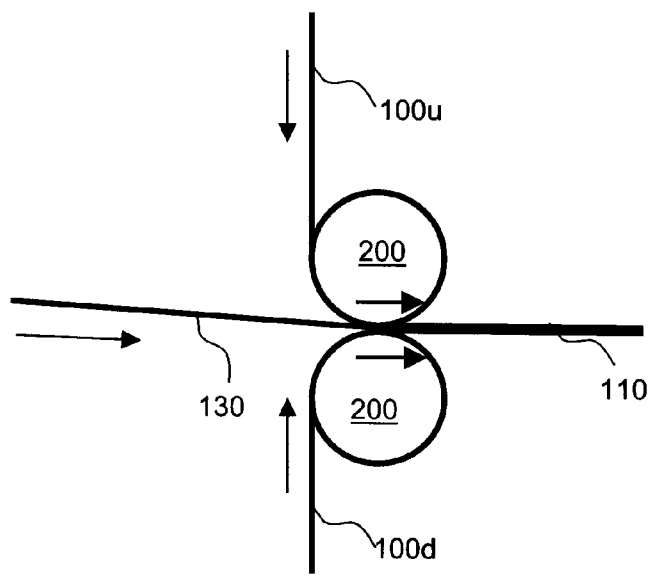

Another web-based processing scheme is illustrate in FIG. 10. As seen in this figure, an upper structure portion 100u (containing, for example, a flexible cover and getter regions), an adhesive layer 130, and a lower structure portion 100d (containing, for example, a substrate and OLED regions) are simultaneously fed through heated rollers 200. As above, the heated rollers soften the adhesive and prevent bubbles from persisting between the adhesive layer 130 and the upper and lower structure portions 100u, 100d. After emerging from the rollers 200, the resulting OLED structure 110 is exposed, for example, to ultraviolet light (not illustrated) to cure the adhesive layer.

Figure 7:
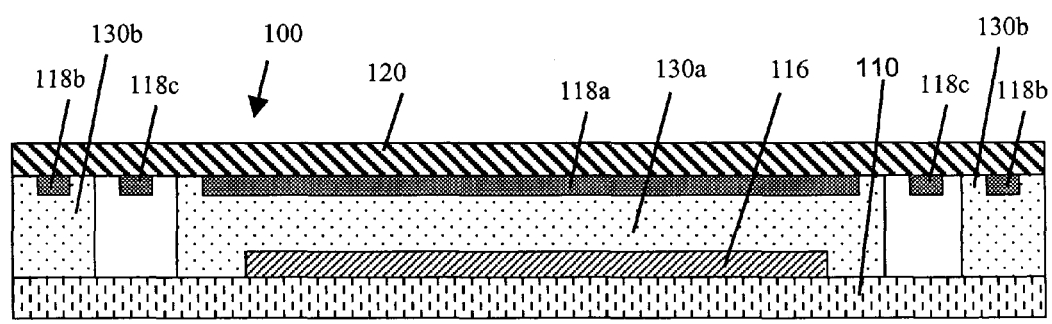

Although the adhesive layers 130 described above in connection with FIGS. 2A, 2B, 3A, 3B and 4 are continuous layers (this configuration is sometimes referred to as a "face seal"), other configurations with discrete adhesive layer portions can also be utilized. For example, in the embodiment illustrated in FIG. 7, the adhesive layer comprises an inner portion 130a that covers the OLED region 116 (e.g., in the form of a rectangular sheet) and a distinct outer portion 130a which laterally surrounds inner portion 130a (e.g., in the form of a rectangular ring).

Somewhat analogously, although the getter regions 118 described above in connection with FIGS. 2A, 2B, 3A, 3B and 4 are continuous regions, other configurations containing discrete getter regions are possible. Referring again to FIG. 7, an inner getter region 118a (e.g., in the form of a rectangular sheet) is provided in connection with the inner adhesive layer portion 130a, while an outer getter region portion 118b (e.g., in the form of a rectangular ring) is provided in connection with the outer adhesive layer portion 130b. Moreover, in the embodiment illustrated, an additional getter region 118c (e.g., in the form of a rectangular ring) is provided in connection with the gap that lies between the inner and outer adhesive layer portions 130a, 130b.

Figure 5:
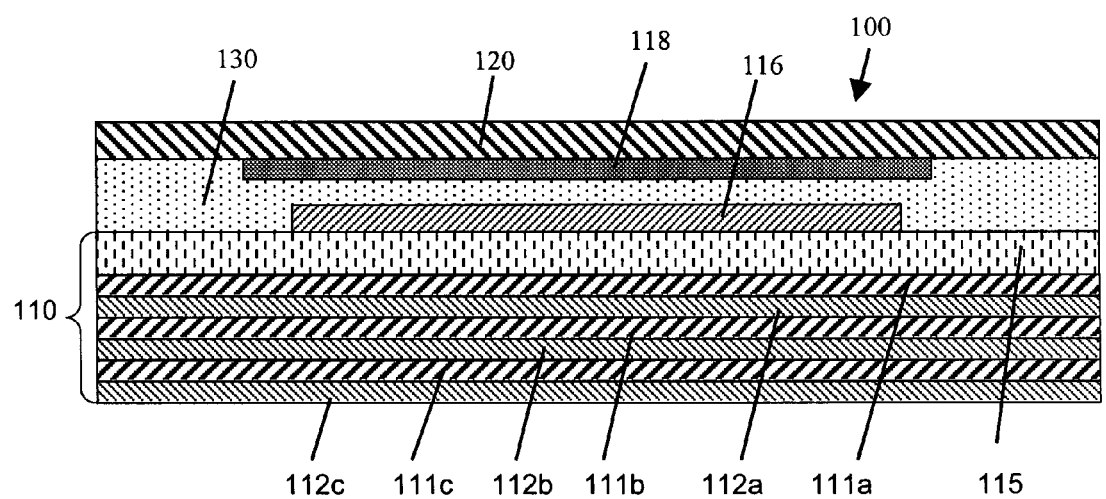

As noted above, composite materials are among those materials preferred for use in connection with the substrates and/or covers of the device structures of the present invention. Referring now to FIG. 5, for example, an OLED structure 100 is illustrated, which is like that of that of FIG. 2A, except that the substrate 110 of FIG. 5 is shown as comprising a substrate sub-layer 115 and a series cooperative barrier sub-layers. The cooperative barrier sub-layers include both sub-layers of planarizing material 111a–c and sub-layers of high-density material 112a–c. These cooperative barrier sub-layers are preferably provided in an alternating configuration. Preferably, 1 to 10 pairs of these sub-layers, more preferably 3 to 7 pairs, are used. Thus, although three alternating pairs are illustrated in FIG. 3, other sub-layer arrangements are possible.

The cooperative barrier sub-layers 111a–c and 112a–c are disposed adjacent the polymeric substrate sub-layer 115 in the embodiment shown in FIG. 5. As a result, during manufacture, the substrate sub-layer 115 can act as a foundation upon which the cooperative barrier sub-layers 111a–c and 112a–c can be applied.

Where flexibility is desired, the substrate sub-layer 115 may comprise paper, fabric, metal foil, flexible glass (available, for example, from Schott Glass Technologies) and/or polymer layers. Flexibility is desirable, for example, in the manufacture of flexible OLEDs, and renders the devices formable using web-based, roll-to-roll manufacturing techniques. More preferred flexible substrate layer materials are those that comprise one or more polymer components, including polyesters, polycarbonates, polyethersulphones, polyethylenenaphthalates, polyarylates, polyimides such as Kapton® polyimide film available from DuPont, fluoropolymers such as Aclar® fluoropolymer available from Honeywell, Appear® PNB (polynorbornene) available from BF Goodrich and Arton® available from BF Goodrich, and polyolefins that are capable of providing a strong adhesive bond with other materials. Such polymer components can be supplied, for example, in connection with homopolymers, copolymers and polymer blends. The substrate layer 115 in this instance typically ranges from 75 to 625 microns in thickness.

By "planarizing material" is meant a material that forms a smooth planar surface upon application, rather than forming a surface that reflects irregular contours of the underlying surface. Preferred planarizing materials include polymers, such as fluorinated polymers, parylenes, cyclotenes and polyacrylates and combinations thereof. Sub-layers of such planarizing materials 111a–111c can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of contaminant and deleterious species, particularly water and oxygen, are hindered. Preferred high-density materials include inorganic materials such as metal oxides, metal nitrides, metal carbides and metal oxynitrides and combinations thereof. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides and combinations thereof. Sub-layers of high-density material 112a–112c can be applied using techniques known in the art such as thermal evaporation, sputtering, PECVD methods and electron-beam techniques.

Examples of composite barrier layers comprising sub-layers of both high-density material and planarizing material formed on a polymer substrate sub-layer are disclosed, for example, in U.S. Pat. No. 5,757,126, the entire disclosure of which is hereby incorporated by reference.

Figure 6:
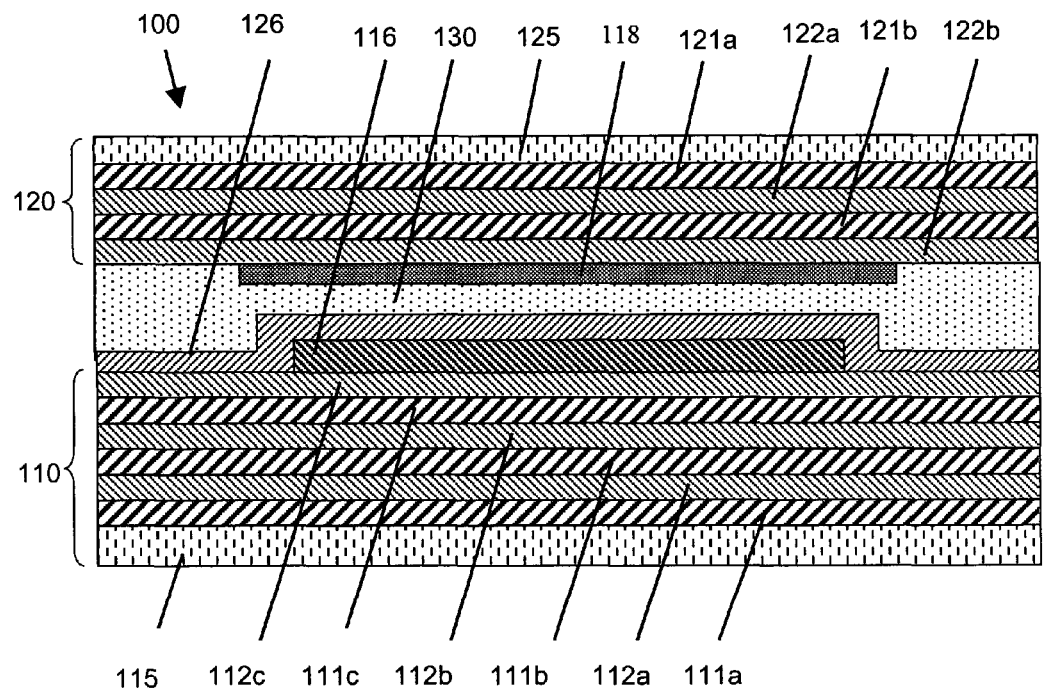

It is noted that the substrate 110 as illustrated in FIG. 5 can be inverted such that the substrate sub-layer 115 is at the bottommost position, as is seen in FIG. 6. Moreover, if desired, the cover 120 can include a composite barrier layer. For example, as seen in FIG. 6, a cover 120 is provided which includes a substrate sub-layer 125, planarizing sub-layers 121a–b and high-density sub-layers 122a–b.

As noted above, due to their flexibility, composite substrates 110 and composite covers 120 are useful in connection with flexible OLED devices. Their flexibility also renders them useful for web-based, roll-to-roll processing.

Figure 4:
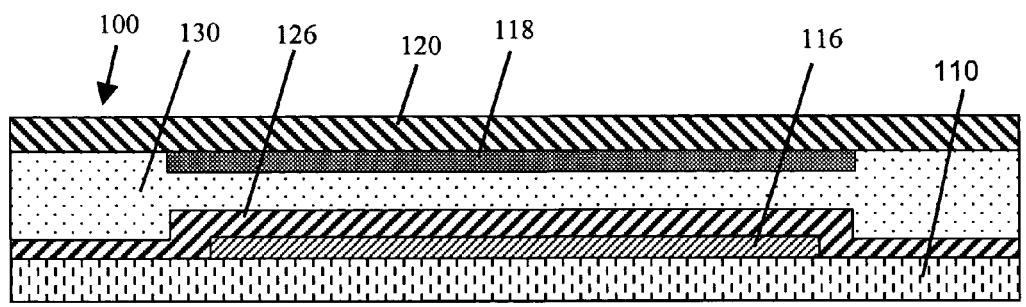
FIGS. 4–7 are schematic cross-sectional views of OLED structures in accordance with various embodiments of the present invention.

In some embodiments of the present invention, a protective layer 126 is provided between the adhesive layer 130 and the OLED region 116 as illustrated in FIGS. 4 and 6. Protective layers are beneficial, for example, where the adhesive layer 130 contains particulate materials that would otherwise harm the OLED region 116. In such instances, the protective layer 126 should be sufficiently thick and/or tough, such that the particulate materials in the adhesive layer 130 do not puncture the protective layer 126 and damage the underlying OLED region 116. Preferred materials for the protective layer 126 include organometallic materials such as copper phthalocyanine (CuPc), organic compounds such as 4,4'-bis[N-(1-napthyl)-N-phenyl-amino] biphenyl (NPD), silicon compounds such as silicon oxide, silicon nitride and silicon oxynitride, metal oxides such as aluminum oxide, indium-tin oxide and zinc indium tin oxide, some of which materials are used as high-density materials for the cooperative barrier sub-layer structures discussed above.

In other embodiments (not illustrated), the protective layer 126 is a composite layer. For example, the protective layer can consist of a high-density sub-layer (e.g., a thin oxide layer) deposited over the OLED, followed by a planarizing sub-layer (e.g., a polymer layer), followed by another high-density (e.g., oxide) sub-layer.

Another way of addressing the presence of particulate materials in the adhesive layer 130 is by providing spacer structures (not shown) to separate the adhesive layer 130 from critical elements within the OLED region 116. For example, where the OLED region contains a plurality of active pixels arranged in rows and columns, such spacer structures can be provided between the active pixels.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An organic electronic device structure comprising:
   a first portion comprising a substrate and an organic electronic device region disposed over the substrate;
   a second portion comprising a cover and a getter region; and
   a radiation-cured, pressure-sensitive adhesive layer disposed between said first and second portions and adhering said first and second portions to one another, said adhesive layer being disposed over the entire organic electronic device region and at least a portion of the substrate.

2. The organic electronic device structure of claim 1, wherein said organic electronic device region is an OLED device region and said organic electronic device structure is and OLED device structure.

3. The organic electronic device structure of claim 2, wherein said OLED device structure is a top-emitting OLED device structure.

4. The organic electronic device structure of claim 2, wherein said OLED device structure is a flexible device structure.

5. The organic electronic device structure of claim 1, wherein said adhesive layer is in the form a continuous layer.

6. The organic electronic device structure of claim 1, wherein said adhesive layer comprises two or more distinct portions.

7. The organic electronic device structure of claim 1, wherein said device comprises a single getter region.

8. The organic electronic device structure of claim 1, wherein said device comprises a plurality of getter regions.

9. The organic electronic device structure of claim 1, wherein said getter region is provided on a surface of said cover.

10. The organic electronic device structure of claim 1, wherein said cover comprises a groove, and wherein said getter region is provided within said groove.

11. The organic electronic device structure of claim 1, wherein said adhesive layer is an ultraviolet-radiation-cured, pressure-sensitive adhesive layer.

12. The organic electronic device structure of claim 1, wherein said adhesive layer displays low out-gassing of harmful species.

13. The organic electronic device structure of claim 1, further comprising a protective layer between said organic electronic device region and said adhesive layer.

14. The organic electronic device structure of claim 13, wherein said protective layer comprises a material selected from a silicon oxide, a silicon nitride, a silicon oxynitride, a metal oxide, an organic compound and an organometallic compound.

15. The organic electronic device structure of claim 1, wherein said device structure comprises a plurality of organic electronic devices.

16. The organic electronic device structure of claim 1, wherein said substrate is selected from a metal substrate, a semiconductor substrate, a glass substrate, a ceramic substrate and a polymer substrate.

17. The organic electronic device structure of claim 1, wherein said substrate is a composite substrate layer comprises (a) a polymer substrate sub-layer and (b) at least two alternating pairs of high-density sub-layers and planarizing sub-layers, which high-density sub-layers may be the same or different from each other and which planarizing sub-layers may be the same or different from each other.

18. The organic electronic device structure of claim 1, wherein said cover is selected from a metal cover, a semiconductor cover, a glass cover, a ceramic cover and a polymer cover layer.

19. The organic electronic device structure of claim 1, wherein said cover is a composite material layer that comprises (a) a polymer substrate sub-layer and (b) at least two alternating pairs of high-density sub-layers and planarizing sub-Layers, which high-density sub-layers may be the same or different from each other and which planarizing sub-layers may be the same or different from each other.

20. The organic electronic device structure of claim 1, wherein said getter region is attached to said cover via an adhesive region.

21. A method of making the organic electronic device structure of claim 1, comprising:
   providing said first and second portions;
   attaching said first portion to said second portion with said adhesive layer by application of pressure; and
   exposing said adhesive layer to radiation.

22. The method of claim 21, wherein said radiation is ultraviolet radiation.

23. The method of claim 21, wherein said second portion is provided by a method comprising: providing said cover; and applying a film of getter material to said cover.

24. The method of claim 23, wherein said film of getter material further comprises an adhesive layer.

25. The method of claim 21, wherein said cover comprises a groove and wherein said second portion is provided by a method comprising: (a) providing said cover; (b) disposing a liquid getter within said groove; and (c) activating said liquid getter.

26. The method of claim 21, wherein said method is a web-based processing method.

27. The method of claim 21, wherein said first portion is adhered to said second portion by a method comprising: (a) providing an adhesive-primed portion comprising (i) said adhesive layer and(ii) one of said first and second portions; and (b) contacting said adhesive-primed portion with the other of said first and second portions.

28. The method of claim 27, wherein the adhesive layer is transferred from a release liner to one of the first and second portions to form said adhesive primed portion.

29. The method of claim 21, further comprising removing gas bubbles that are trapped (a) within the adhesive layer or (b) between said adhesive layer and either or both of the first and second portions.

30. The method of claim 29, wherein said bubbles are removed by the application of one or more of (a) heat, (b) pressure, and (c) vacuum.

31. An OLED device structure comprising:
a first portion comprising a substrate and an OLED device region disposed over the substrate;
a second portion comprising a cover and a getter region; and
a radiation-cured, pressure-sensitive adhesive layer disposed between said first and second portions and adhering said first and second portions to one another, said adhesive layer being disposed over the entire OLED device region and at least a portion of the substrate
wherein said OLED device structure is at most 0.4 mm in thickness.

* * * * *

UNITED STATES PATENT AND TRADEMARK OFFICE
CERTIFICATE OF CORRECTION

PATENT NO. : 6,998,648 B2
APPLICATION NO. : 10/648763
DATED : February 14, 2006
INVENTOR(S) : Jeffrey Alan Silvernail It is certified that error appears in the above-identified patent and that said Letters Patent is hereby corrected as shown below:

Claim 1, Col. 11, line 64, change first word "and" to - - an - -.

Claim 17, Col. 12, lines 42-43, after "layer", change "com-prises" to - - com-prising - -.

Claim 19, Col. 12, line 56, change first word "sub-Layers", to - - sub-layers - -.

Claim 31, Col. 14, line 19, after last word "substrate", insert - - , - -.

Signed and Sealed this

Fifteenth Day of August, 2006

JON W. DUDAS
*Director of the United States Patent and Trademark Office*

UNITED STATES PATENT AND TRADEMARK OFFICE
CERTIFICATE OF CORRECTION

PATENT NO.        : 6,998,648 B2                                      Page 1 of 1
APPLICATION NO. : 10/648763
DATED             : February 14, 2006
INVENTOR(S)       : Jeffrey Alan Silvernail It is certified that error appears in the above-identified patent and that said Letters Patent is hereby corrected as shown below:

In column 14, lines 3-4, delete "Bet of historical" and insert therefore --set of historical--.

Specification, Col. 1, line 45, after "a", change "light emitting" to -- light-emitting --.

Specification, Col. 1, line 47, after "the", delete "a", and change "light emitting" to -- light-emitting --.

Specification, Col. 5, line 35, after "8141", insert -- , --.

Specification, Col. 7, line 7, delete last word "with,".

Specification, Col. 7, line 17, delete last word "is".

Specification, Col. 9, line 27, after "is", change "illustrate" to -- illustrated --.

Specification, Col. 9, line 66, before last word "FIG.", delete "that of".

Specification, Col. 10, line 1, after "series", insert -- of --.

Claim 2 column 11, line 64, change "and" to -- an --.

Signed and Sealed this

Sixteenth Day of January, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,998,648 B2 | Page 1 of 1 |
| APPLICATION NO. | : 10/648763 | |
| DATED | : February 14, 2006 | |
| INVENTOR(S) | : Jeffrey Alan Silvernail | |

It is certified that error appears in the above-identified patent and that said Letters Patent is hereby corrected as shown below:

Specification, Col. 1, line 45, after "a", change "light emitting" to

-- light-emitting --.

Specification, Col. 1, line 47, after "the", delete "a", and change "light emitting"

to -- light-emitting --.

Specification, Col. 5, line 35, after "8141", insert -- , --.

Specification, Col. 7, line 7, delete last word "with,".

Specification, Col. 7, line 17, delete last word "is".

Specification, Col. 9, line 27, after "is", change "illustrate" to -- illustrated --.

Specification, Col. 9, line 66, before last word "FIG.", delete "that of".

Specification, Col. 10, line 1, after "series", insert -- of --.

Claim 2 column 11, line 64, change first word "and" to -- an --.

This certificate supersedes Certificate of Correction issued January 16, 2007.

Signed and Sealed this

Thirtieth Day of October, 2007

JON W. DUDAS
*Director of the United States Patent and Trademark Office*